(12) United States Patent
Gopal et al.

(10) Patent No.: US 11,913,554 B2
(45) Date of Patent: Feb. 27, 2024

(54) COOLANT DISTRIBUTION MODULE FOR ELECTRIFIED VEHICLE

(71) Applicant: Ford Global Technologies, LLC, Dearborn, MI (US)

(72) Inventors: Ravi Gopal, Novi, MI (US); Daniel C. Huang, Rochester Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 18/204,500

(22) Filed: Jun. 1, 2023

(65) Prior Publication Data

US 2023/0323966 A1   Oct. 12, 2023

Related U.S. Application Data

(63) Continuation of application No. 17/386,806, filed on Jul. 28, 2021, now Pat. No. 11,703,137.

(51) Int. Cl.
*G06F 1/16* (2006.01)
*H05K 5/00* (2006.01)
(Continued)

(52) U.S. Cl.
CPC .......... *F16K 11/10* (2013.01); *B60H 1/00278* (2013.01); *B60K 11/04* (2013.01);
(Continued)

(58) Field of Classification Search
CPC ........ F16K 11/10; F16K 11/105; F16K 11/14; F16K 11/18; F16K 11/20; B60H 1/00278;
(Continued)

(56) References Cited

U.S. PATENT DOCUMENTS

| | | | | |
|---|---|---|---|---|
| 7,905,106 B2* | 3/2011 | Attlesey | ............. | H05K 7/20772 165/80.4 |
| 8,089,766 B2* | 1/2012 | Attlesey | ............. | H05K 7/20772 165/104.19 |

(Continued)

FOREIGN PATENT DOCUMENTS

CN            112277559 A       1/2021

*Primary Examiner* — Anthony M Haughton
(74) *Attorney, Agent, or Firm* — David B. Kelley; Carlson, Gaskey & Olds, P.C.

(57) ABSTRACT

This disclosure details a coolant distribution module as used in a thermal management systems for thermally managing electrified vehicle components. An exemplary coolant distribution module includes a module body including a plurality of inlet ports and a plurality of outlet ports, a first manifold valve encompassed within the module body, and a second manifold valve encompassed within the module body. The first manifold valve includes a plurality of first valve inputs wherein each first valve input is in communication with at least one inlet port of the plurality of inlet ports, and a plurality of first valve outputs wherein each first valve output is in communication with at least one outlet port of the plurality of outlet ports. The second manifold valve includes a plurality of second valve inputs wherein each second valve input is in communication with at least one inlet port of the plurality of inlet ports, and a plurality of second valve outputs wherein each second valve output is in communication with at least one outlet port of the plurality of outlet ports.

20 Claims, 4 Drawing Sheets

(51) Int. Cl.
  *H05K 7/00* (2006.01)
  *F16K 11/10* (2006.01)
  *B60K 11/04* (2006.01)
  *H05K 7/20* (2006.01)
  *B60H 1/00* (2006.01)

(52) U.S. Cl.
  CPC ..... *H05K 7/20881* (2013.01); *H05K 7/20936* (2013.01); *B60H 2001/00307* (2013.01)

(58) Field of Classification Search
  CPC .... B60H 1/00271; B60K 11/04; B60K 11/02; B60K 11/06; H05K 7/20881; H05K 7/20936; H05K 7/20845; H05K 7/2089
  See application file for complete search history.

(56) References Cited

U.S. PATENT DOCUMENTS

| | | | | |
|---|---|---|---|---|
| 9,426,927 B2 * | 8/2016 | Shafer | | G06F 1/20 |
| 9,451,726 B2 * | 9/2016 | Regimbal | | H05K 7/207 |
| 9,496,200 B2 * | 11/2016 | Lyon | | H05K 7/20781 |
| 9,504,184 B2 * | 11/2016 | Krug, Jr. | | H05K 7/20218 |
| 9,655,281 B2 * | 5/2017 | Harvilchuck | | F16L 37/18 |
| 10,123,464 B2 * | 11/2018 | Moore | | H05K 7/20818 |
| 10,866,037 B2 | 12/2020 | Lotha | | |
| 11,465,248 B1 * | 10/2022 | Tsai | | H01L 23/473 |
| 11,473,860 B2 * | 10/2022 | Holden | | F28F 27/00 |
| 2009/0262501 A1 | 10/2009 | Claassen et al. | | |
| 2010/0101765 A1 * | 4/2010 | Campbell | | H05K 7/20809 |
| | | | | 361/699 |
| 2010/0103614 A1 | 4/2010 | Campbell et al. | | |
| 2010/0246118 A1 * | 9/2010 | Attlesey | | H05K 7/20236 |
| | | | | 165/104.31 |
| 2013/0106165 A1 | 5/2013 | Oddie et al. | | |
| 2013/0112378 A1 | 5/2013 | Shelnutt et al. | | |
| 2013/0312839 A1 | 11/2013 | Shelnutt et al. | | |
| 2014/0202678 A1 | 7/2014 | Goth et al. | | |
| 2016/0066480 A1 | 3/2016 | Eckberg et al. | | |
| 2016/0366792 A1 | 12/2016 | Smith et al. | | |
| 2017/0049009 A1 | 2/2017 | Steinke et al. | | |
| 2020/0404812 A1 | 12/2020 | Gao | | |

* cited by examiner

COOLANT DISTRIBUTION MODULE FOR ELECTRIFIED VEHICLE

CROSS-REFERENCE TO RELATED APPLICATION

This application is a continuation of prior U.S. application Ser. No. 17/386,806, filed Jul. 28, 2021, and which is incorporated herein by reference.

TECHNICAL FIELD

This disclosure relates to a coolant distribution module for an electrified vehicle.

BACKGROUND

In general, electrified vehicles differ from conventional motor vehicles because they are selectively driven by one or more battery powered electric machines. Conventional motor vehicles, by contrast, rely exclusively on the internal combustion engine to propel the vehicle.

A high voltage traction battery pack typically powers the electric machines and other electrical loads of the electrified vehicle. The traction battery pack may include one or more groupings of interconnected battery cells. The battery cells generate heat during certain conditions, including during charging and discharging operations. Battery thermal management systems may be employed to manage the heat generated by the battery cells.

SUMMARY

A coolant distribution module according to an exemplary aspect of the present disclosure includes, among other things, a module body including a plurality of inlet ports and a plurality of outlet ports, a first manifold valve encompassed within the module body, and a second manifold valve encompassed within the module body. The first manifold valve includes a plurality of first valve inputs wherein each first valve input is in communication with at least one inlet port of the plurality of inlet ports, and a plurality of first valve outputs wherein each first valve output is in communication with at least one outlet port of the plurality of outlet ports. The second manifold valve includes a plurality of second valve inputs wherein each second valve input is in communication with at least one inlet port of the plurality of inlet ports, and a plurality of second valve outputs wherein each second valve output is in communication with at least one outlet port of the plurality of outlet ports.

In a further non-limiting embodiment of the foregoing module, the first manifold valve comprises a first multi-port manifold valve and wherein the second manifold valve comprises a second multi-port manifold valve, and wherein the first and second multi-port manifold valves are controlled by a control unit to provide multiple operating states via multiple combinations of flow distribution paths between the pluralities of the first and second valve inputs and the pluralities of the first and second valve outputs.

In a further non-limiting embodiment of either of the modules, the first multi-port manifold valve comprises a first manifold valve operating at a Range A temperature and wherein the second multi-port manifold valve comprises a second manifold valve operating at a Range B temperature.

In a further non-limiting embodiment of any of the modules, the plurality of first valve inputs comprise at least four Range A valve inputs and the plurality of first valve outputs comprise at least five Range A valve outputs, and wherein the plurality of second valve inputs comprise at least four Range B valve inputs and the plurality of second valve outputs comprise at least five Range B valve outputs.

In a further non-limiting embodiment of any of the modules, at least one of the four Range A valve inputs is in communication with a fluid outlet from at least one first heat exchanger, at least one of the four Range A valve inputs is in communication with a fluid outlet from a HVAC or cabin heat exchanger, at least one of the four Range A valve inputs is in communication with a fluid outlet from a power electronics module, and at least one of the four Range A valve inputs is in communication with a fluid outlet from a battery pack.

In a further non-limiting embodiment of any of the modules, the at least one of the four Range A valve inputs that is in communication with the fluid outlet from the at least one first heat exchanger is also in communication with a fluid outlet from a second heat exchanger.

In a further non-limiting embodiment of any of the modules, the at least one of the four Range A valve inputs that is in communication with the fluid outlet from the battery pack is also in communication with a fluid outlet from a HVAC or cabin heat exchanger.

In a further non-limiting embodiment of any of the modules, at least one of the five Range A valve outputs is in communication with a fluid inlet to the at least one first heat exchanger, at least one of the five Range A valve outputs is in communication with a fluid inlet to a radiator, at least one of the five Range A valve outputs is in communication with a fluid inlet to the HVAC or cabin heat exchanger, at least one of the five Range A valve outputs is in communication with a fluid inlet to the power electronics module, and at least one of the five Range A valve outputs is in communication with a fluid inlet to the battery pack.

In a further non-limiting embodiment of any of the modules, the at least one of the five Range A valve outputs that is in communication with the fluid inlet to the at least one first heat exchanger is also in communication with a fluid inlet to a second heat exchanger.

In a further non-limiting embodiment of any of the modules, at least one of the four Range B valve inputs is in communication with a fluid outlet from at least one second heat exchanger, at least one of the four Range B valve inputs is in communication with a fluid outlet from at least one third heat exchanger, at least one of the four Range B valve inputs is in communication with the fluid outlet from the power electronics module, and at least one of the four c Range B old valve inputs is in communication with the fluid outlet from the battery pack.

In a further non-limiting embodiment of any of the modules, the at least one of the four Range B valve inputs that is in communication with the fluid outlet from the at least one second heat exchanger is also in communication with a fluid outlet from a fourth heat exchanger.

In a further non-limiting embodiment of any of the modules, the at least one of the four Range B valve inputs that is in communication with the fluid outlet from the battery pack is also in communication with the fluid outlet from a HVAC or cabin heat exchanger.

In a further non-limiting embodiment of any of the modules, at least one of the five Range B valve outputs is in communication with a fluid inlet to the at least one second heat exchanger, at least one of the five Range B valve outputs is in communication with the fluid inlet to the radiator, at least one of the five Range B valve outputs is in communication with a fluid inlet to a HVAC or cabin heat exchanger, at least one of the five Range B valve outputs is in communication with the fluid inlet to the power electronics module, and at least one of the five Range B valve outputs is in communication with the fluid inlet to the battery pack.

In a further non-limiting embodiment of any of the modules, the at least one of the five Range B valve outputs that is in communication with the fluid inlet to the at least one second heat exchanger is also in communication with the fluid inlet to the at least one third heat exchanger, and is also in communication with a fluid inlet to a fourth heat exchanger.

In a further non-limiting embodiment of any of the modules, the module body is associated with a coolant distribution system that has only one T-fitting, and wherein the T-fitting has an outlet in communication with the inlet to the power electronics module, a first inlet in communication with an outlet from the radiator, and a second inlet in communication with one outlet port from the plurality of the outlet ports, wherein the one outlet port is in communication with the at least one of the five Range B valve outputs that is in communication with the fluid inlet to the power electronics module and is in communication with the at least one of the five Range A valve outputs that is in communication with the fluid inlet to the power electronics module.

A coolant distribution system according to an exemplary aspect of the present disclosure includes, among other things, a single module body to include a plurality of inlet ports and a plurality of outlet ports, wherein the single module body includes a first multi-port manifold valve formed within the single module body and a second multi-port manifold valve formed within the single module body. The first multi-port manifold valve includes a plurality of first valve inputs wherein each first valve input is in communication with at least one inlet port of the plurality of inlet ports, and a plurality of first valve outputs wherein each first valve output is in communication with at least one outlet port of the plurality of outlet ports. The second multi-port manifold valve includes a plurality of second valve inputs wherein each second valve input is in communication with at least one inlet port of the plurality of inlet ports, and a plurality of second valve outputs wherein each second valve output is in communication with at least one outlet port of the plurality of outlet ports. The system further includes a plurality of heat exchangers wherein each heat exchanger includes an inlet in communication with at least one of the plurality of outlet ports and an outlet in communication with at least one of the plurality of inlet ports. The system further includes a power electronics module having an inlet in communication with a first outlet port of the plurality of outlet ports, wherein the first outlet port is in communication with one first valve output and one second valve output, and the power electronics module having an outlet in communication with a first inlet port of the plurality of inlet ports, wherein the first inlet port is in communication with one first valve input and one second valve input. The system further includes a radiator having a radiator inlet in communication with a second outlet port of the plurality of outlet ports, wherein the second outlet port is in communication with one first valve output and one second valve output, and the radiator having a radiator outlet in communication with the inlet to the power electronics module. The system further includes a battery back having an inlet in communication with a third outlet port of the plurality of outlet ports, wherein the third outlet port is in communication with one first valve output and one second valve output, and the battery pack having an outlet in communication with a second inlet port of the plurality of inlet ports, wherein the second inlet port is in communication with one first valve input and one second valve input. The system further includes a HVAC system having first HVAC or cabin heat exchanger and a second HVAC or cabin heat exchanger, the first HVAC or cabin heat exchanger having an inlet in communication with a fourth outlet port of the plurality of outlet ports, wherein the fourth outlet port is in communication with one first valve output, and the first HVAC or cabin heat exchanger having an outlet in communication with a third inlet port of the plurality of inlet ports, wherein the third inlet port is in communication with one first valve input, and wherein the second HVAC or cabin heat exchanger has an inlet in communication with a fifth outlet port of the plurality of outlet ports, wherein the fifth outlet port is in communication with one second valve output, and the second HVAC or cabin heat exchanger has an outlet in communication with a fourth inlet port of the plurality of inlet ports, wherein the fourth inlet port is in communication with one first valve input and one second valve input.

In a further non-limiting embodiment of the foregoing system, only one T-fitting is used within the coolant distribution system, the T-fitting having an outlet in communication with the inlet to the power electronics module, a first inlet in communication with the radiator outlet, and a second inlet in communication with the first outlet port.

In a further non-limiting embodiment of either of the foregoing systems, the system includes degas bottle line connections to the module body with associated inlet and outlet ports.

A method according to another exemplary aspect of the present disclosure includes, among other things: forming a single module body to include a plurality of inlet ports and a plurality of outlet ports; forming a first manifold valve within the single module body, wherein the first manifold valve includes a plurality of first valve inputs wherein each first valve input is in communication with at least one inlet port of the plurality of inlet ports, and a plurality of first valve outputs wherein each first valve output is in communication with at least one outlet port of the plurality of outlet ports; and forming a second manifold valve within the single module body, wherein the second manifold valve includes a plurality of second valve inputs wherein each second valve input is in communication with at least one inlet port of the plurality of inlet ports, and a plurality of second valve outputs wherein each second valve output is in communication with at least one outlet port of the plurality of outlet ports.

In a further non-limiting embodiment of the foregoing method, the method includes forming the single module body using an additive manufacturing process, and optionally, including forming the first manifold valve as a first multi-port manifold valve and the second manifold valve as a second multi-port manifold valve, and connecting the single module body to a coolant distribution system that includes a plurality of heat exchangers, a radiator, a power electronics module, a battery back, and a HVAC system, wherein only one T-fitting is used within the coolant distribution system.

The embodiments, examples, and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure details a coolant distribution module for a thermal management system for an electrified vehicle. An exemplary coolant distribution module may be configured to comprise a single manifold body that includes first and second manifold valves that each include multiple inputs and outputs. These and other features are discussed in greater detail in the following paragraphs of this detailed description.

Figure 1:
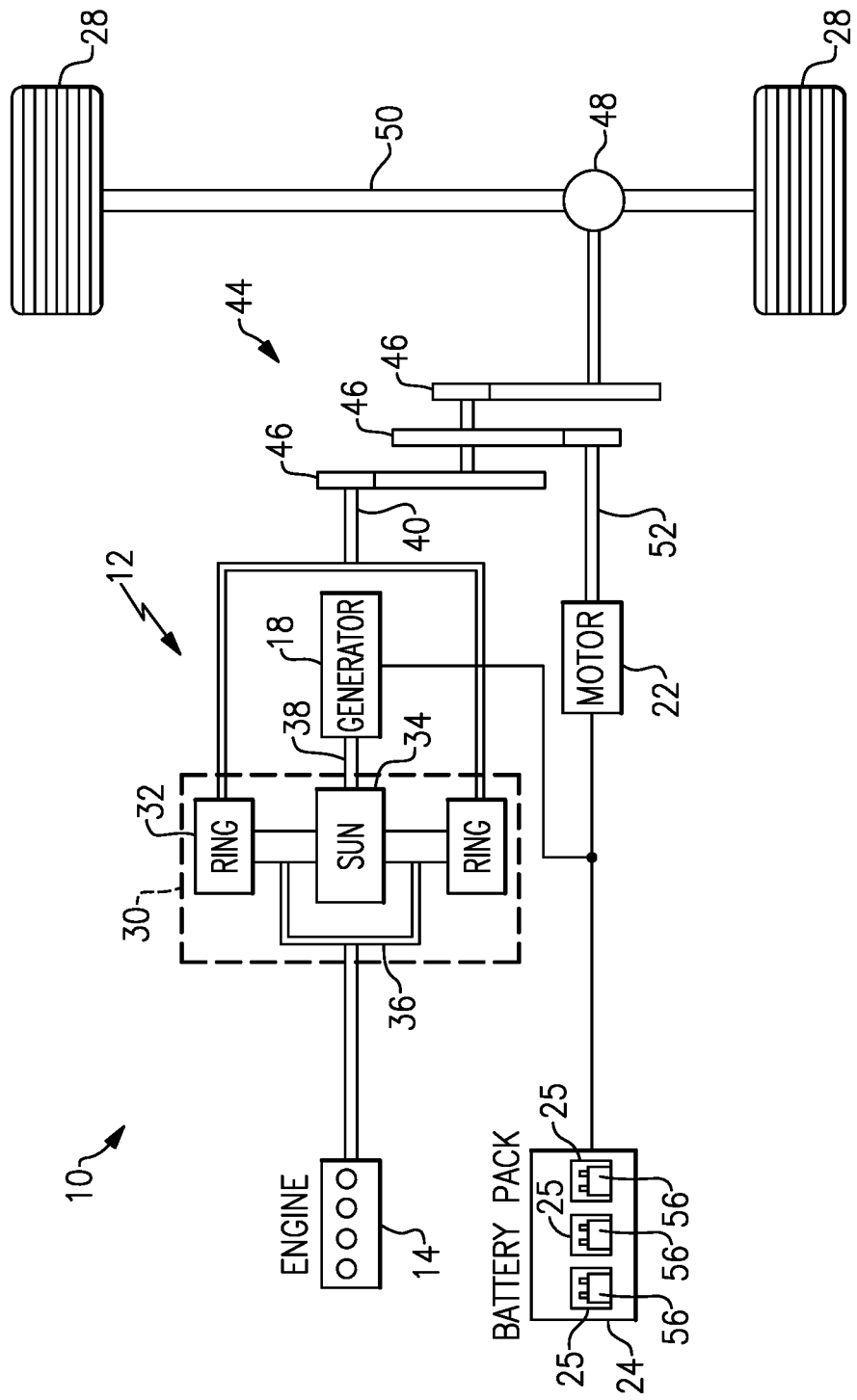
FIG. 1 schematically illustrates a powertrain of an electrified vehicle.

FIG. 1 shows an example propulsion system for one type of vehicle that incorporates the coolant distribution module of the disclosure. The coolant distribution module could also be used with any other type of electrified vehicle. FIG. 1 schematically illustrates a powertrain 10 for an electrified vehicle 12. Although depicted as a hybrid electric vehicle (HEV), it should be understood that the concepts described herein are not limited to HEVs and could extend to other electrified vehicles, including, but not limited to, plug-in hybrid electric vehicles (PHEVs), battery electric vehicles (BEVs), fuel cell vehicles, etc.

In an embodiment, the powertrain 10 is a power-split powertrain system that employs first and second drive systems. The first drive system includes a combination of an engine 14 and a generator 18 (i.e., a first electric machine). The second drive system includes at least a motor 22 (i.e., a second electric machine), the generator 18, and a battery pack 24. In this example, the second drive system is considered an electric drive system of the powertrain 10. The first and second drive systems are each capable of generating torque to drive one or more sets of vehicle drive wheels 28 of the electrified vehicle 12. Although a power-split configuration is depicted in FIG. 1, this disclosure extends to any hybrid or electric vehicle including full hybrids, parallel hybrids, series hybrids, mild hybrids, or micro hybrids.

The engine 14, which may be an internal combustion engine, and the generator 18 may be connected through a power transfer unit 30, such as a planetary gear set. Of course, other types of power transfer units, including other gear sets and transmissions, may be used to connect the engine 14 to the generator 18. In a non-limiting embodiment, the power transfer unit 30 is a planetary gear set that includes a ring gear 32, a sun gear 34, and a carrier assembly 36.

The generator 18 can be driven by the engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In a non-limiting embodiment, the second power transfer unit 44 is mechanically coupled to an axle 50 through the differential 48 to distribute torque to the vehicle drive wheels 28.

The motor 22 can also be employed to drive the vehicle drive wheels 28 by outputting torque to a shaft 52 that is also connected to the second power transfer unit 44. In a non-limiting embodiment, the motor 22 and the generator 18 cooperate as part of a regenerative braking system in which both the motor 22 and the generator 18 can be employed as motors to output torque. For example, the motor 22 and the generator 18 can each output electrical power to the battery pack 24.

The battery pack 24 is an exemplary electrified vehicle battery. The battery pack 24 may be a high voltage traction battery pack that includes a plurality of battery arrays 25 (i.e., battery assemblies or groupings of battery cells 56) capable of outputting electrical power to operate the motor 22, the generator 18, and/or other electrical loads of the electrified vehicle 12 for providing power to propel the wheels 28. Other types of energy storage devices and/or output devices could also be used to electrically power the electrified vehicle 12.

The battery cells 56 of the battery pack 24 are sensitive to temperature. The battery cells 56 must typically be maintained within a relatively narrow temperature range (e.g., between 20° C. and 60° C.) in order for the battery pack 24 to meet expected power demand and/or charge acceptance performance. This disclosure therefore details example systems and methods that can manage the temperature of the battery pack 24 and other electric drive components in order to improve the performance of the battery pack.

A thermal management system is important for the electric vehicle in terms of battery range, performance, occupant comfort, etc. One challenge of for thermal systems is the incorporation of complex coolant circuitry involving many coolant lines in series and parallel with multiple valves and heat exchangers. This significant number of components and the associated complex connection configurations can be disadvantageous in relation to vehicle energy efficiency, packaging, and cost in product and manufacturing. The subject disclosure provides a lower cost and efficient thermal system architecture that can improve range during cold and hot ambient conditions, as well as being a modular, reusable and scalable configuration that can be incorporated in a variety of different vehicles.

Figure 2:
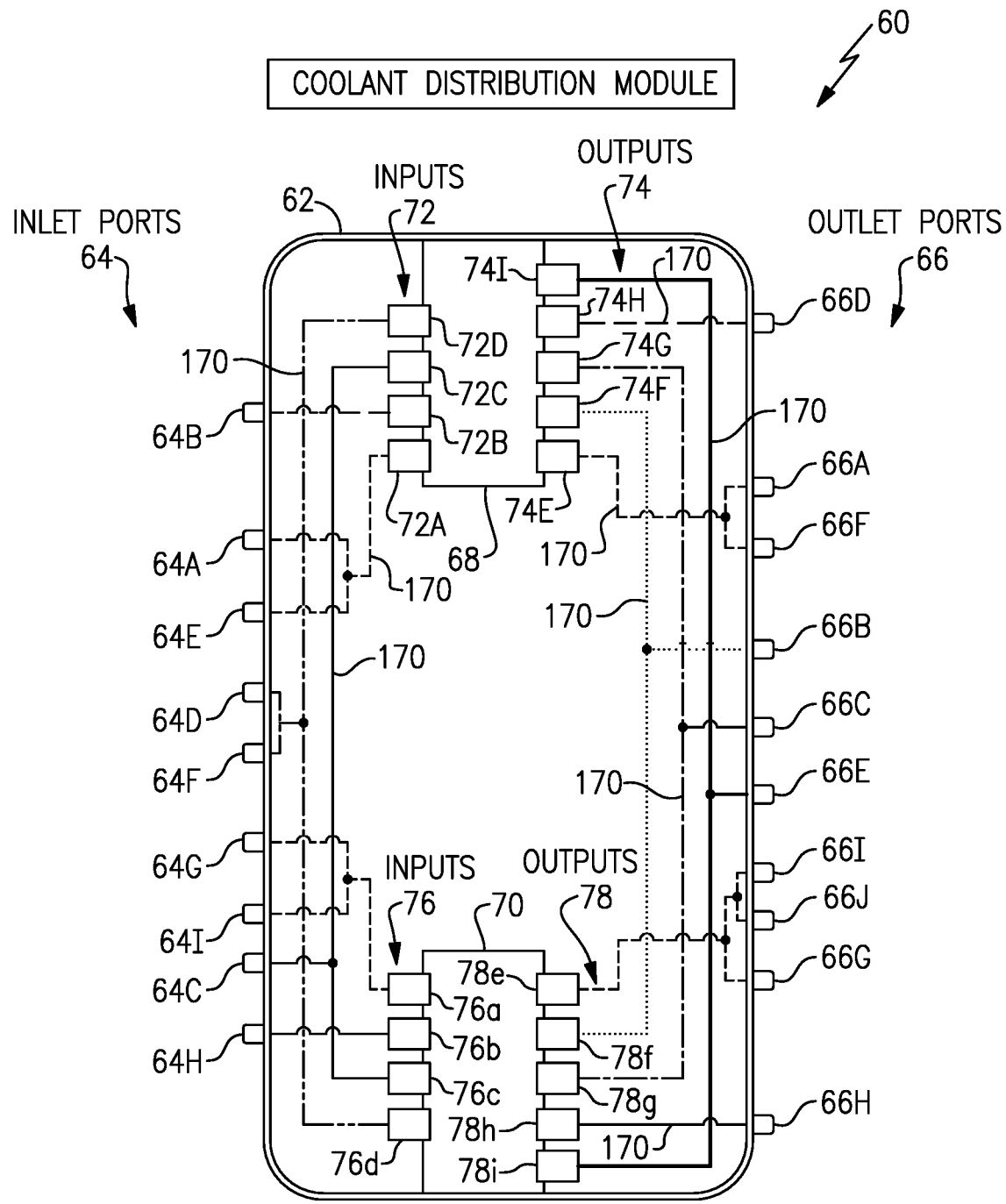
FIG. 2 schematically illustrates a coolant distribution module for an electrified vehicle.

FIG. 2 shows an example coolant distribution module that integrates two multi-port valves to provide various functional capabilities of the thermal system architecture. In this example, two 9-way valves are disclosed; however, this is merely one example and it should be understood that the two multi-port valves could have any number of ports in any combination with an appropriate linking circuit between them to enable the required functionality of the thermal system architecture. FIG. 2 schematically illustrates one example of a coolant distribution module 60 that comprises a module body 62 that includes a plurality of inlet ports 64 and a plurality of outlet ports 66. A first manifold valve 68 and a second manifold valve 70 are encompassed within the module body 62. The first manifold valve 68 includes a plurality of first valve inputs 72 and a plurality of first valve outputs 74. Each first valve input 72 is in communication with at least one inlet port 64 and each first valve output 74 is in communication with at least one outlet port 66. The second manifold valve includes a plurality of second valve inputs 76 and a plurality of second valve outputs 78. Each second valve input 76 is in communication with at least one inlet port 64 and each second valve output 78 is in communication with at least one outlet port 66.

In one example, the module body 62 comprises a single-piece, unitary body that incorporates both the first 68 and second 70 manifold valves.

In one example, the first manifold valve 68 comprises a first nine-way manifold valve and the second manifold valve 70 comprises a second nine-way manifold valve. The first and second nine-way manifold valves have the capability of being controlled to provide multiple operating states by connecting the internal flow passages between the various valve inlet and outlet ports. Additionally, various combinations of the first and second nine-way manifold valves in its different states can enable multiple flow distribution paths between the inlet and outlet ports of the coolant distribution module to deliver a number of operating modes for improved efficiency and performance of the vehicle thermal management system. The multiple flow distribution paths are configured to be used in various combinations to provide the desired operating states. All the valve states and the corresponding operating modes of the coolant distribution module are enabled through a control strategy implemented in a programmable control unit C.

In one example, the first nine-way manifold valve comprises a first manifold valve operating at a first temperature range, e.g. Range A, and the second nine-way manifold valve comprises a second manifold valve operating at a second temperature range, e.g. Range B, different from the first temperature range.

In one example, the plurality of first valve inputs 72 comprise four Range A valve inputs 72A-D and the plurality of first valve outputs 74 comprise five Range A valve outputs 74E-I, and the plurality of second valve inputs 76 comprise four Range B valve inputs 76a-d and the plurality of second valve outputs 78 comprise five Range B valve outputs 78e-i.

Figure 4:
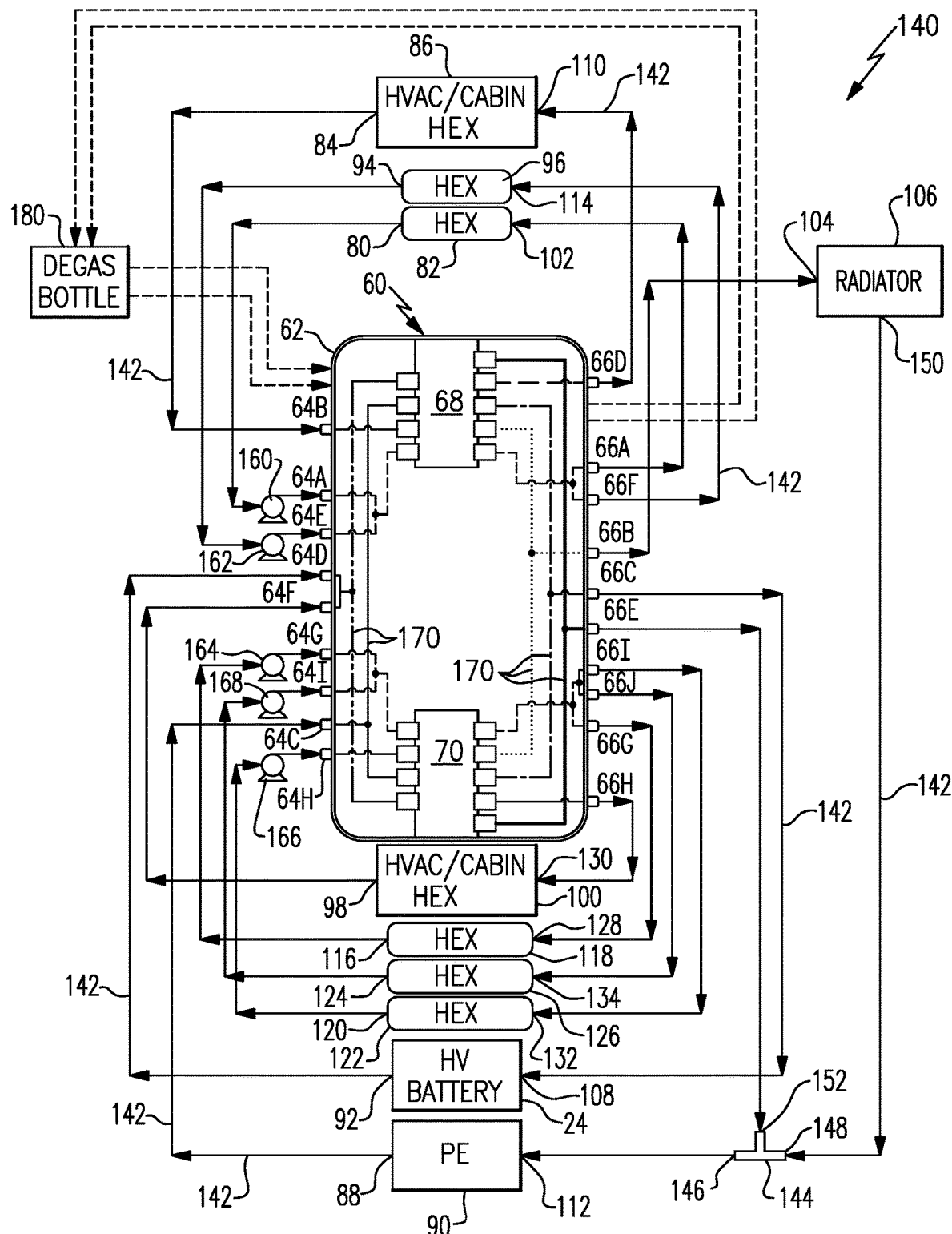
FIG. 4 schematically illustrates the coolant distribution module fluidly connected to a thermal management system of the electrified vehicle.

The coolant distribution module 60 of FIG. 2 is used in thermal management system 140 with a plurality of system components as shown in FIG. 4. In one example configuration: a first Range A valve input 72A is in communication with a fluid outlet 80 from at least one first heat exchanger 82 (FIG. 4) via a first inlet port 64A; a second Range A valve input 72B is in communication with a fluid outlet 84 from a HVAC or cabin heat exchanger 86 via a second inlet port 64B; a third Range A valve input 72C is in communication with a fluid outlet 88 from a power electronics module 90 via a third inlet port 64C; and a fourth Range A valve input 72D is in communication with a fluid outlet 92 from the battery pack 24 via a fourth inlet port 64D.

In one example, the first Range A valve input 72A is also in communication with a fluid outlet 94 from a second heat exchanger 96 via a fifth inlet port 64E.

In one example, the fourth Range A valve input 72D is also in communication with a fluid outlet 98 from a HVAC or cabin heat exchanger 100 via a sixth inlet port 64F.

In one example configuration: a first Range A valve output 74E is in communication with a fluid inlet 102 to the first heat exchanger 82 via a first outlet port 66A; a second Range A valve output 74F is in communication with a fluid inlet 104 to a radiator 106 via a second outlet port 66B; a third Range A valve output 74G is in communication with a fluid inlet 108 to the battery pack 24 via a third outlet port 66C; a fourth Range A valve outputs 74H is in communication with a fluid inlet 110 to the HVAC or cabin heat exchanger 86 via a fourth outlet port 66D; and a fifth Range A valve output 74I is in communication with a fluid inlet 112 to the power electronics module 90 via a fifth outlet port 66E.

In one example, the first Range A valve output 74E is also in communication with a fluid inlet 114 to the second heat exchanger 96 via a sixth outlet port 66F.

In one example configuration: a first Range B valve input 76a is in communication with a fluid outlet 116 from a third heat exchanger 118 via a seventh inlet port 64G; a second Range B valve input 76b is in communication with a fluid outlet 120 from fourth heat exchanger 122 via an eighth inlet port 64H; a third Range B valve input 67c is in communication with the fluid outlet 88 from the power electronics module 90 via the third inlet port 64 C; and the fourth Range B valve input 76d is in communication with the fluid outlet 92 from the battery pack 25 via the fourth inlet port 64D.

In one example, the first Range B valve input 76a is also in communication with a fluid outlet 124 from a fifth heat exchanger 126 via a ninth inlet port 64I.

In one example, the fourth Range B valve input 76d is also in communication with the fluid outlet 98 from the HVAC or cabin heat exchanger 100 via the sixth inlet port 64F.

In one example configuration: the first Range B valve output 78e is in communication with a fluid inlet 128 to the third heat exchanger 118 via a seventh outlet port 66G; a second Range B valve output 78f is in communication with the fluid inlet 104 to the radiator 106 via the second outlet port 66B; the third Range B valve output 78g is in communication with the fluid inlet 108 to the battery pack 24 via the third outlet port 66C; the fourth Range B valve output 78h is in communication with a fluid inlet 130 to the HVAC or cabin heat exchanger 100 via an eight outlet port 66H; and the fifth col Range B d valve output 78i is in communication with the fluid inlet 112 to the power electronics module 90 via the fifth outlet port 66E.

In one example, the first Range B valve output 78e is also in communication with a fluid inlet 132 to the fourth heat exchanger 122 via ninth outlet port 66I, and is also in communication with a fluid inlet 134 to the fifth heat exchanger 126 via a tenth outlet port 66J.

FIG. 4 schematically illustrates the thermal management system 140 that can be incorporated into the electrified vehicle 12, and which incorporates the coolant distribution module 60. The vehicle thermal management system 140 may be controlled to manage the thermal loads generated by various vehicle components, such as the battery pack 24, cabin/HVAC, and the power electronics module 90 of the electrified vehicle 12, for example. Although shown schematically, the power electronics module 90 could include one or more of a DC-DC converter, a motor controller (which may be referred to as an inverter system controller or ISC), a belt integrated starter generator (BISG), etc.

In an embodiment, the thermal management system 140 selectively communicates a coolant through the battery pack 24 to cool the battery pack 24 by removing heat from the battery cells 56, and communicates the coolant through the power electronics module 90 for removing heat from the components of the power electronics module 90 and cabin.

The thermal management system 140 includes a plurality of tubes, pipes, or hoses 142 for circulating the coolant through the various components and which are connected to the inlet 64 and outlet 66 ports of the coolant distribution module 60 to achieve a desired cooling configuration. The coolant distribution module 60 includes a plurality of internal channels 170 formed within the module body 62 that fluidly connect the first valve inputs 72, first valve outputs 74, the second valve inputs 76, and the second valve outputs 78 to the inlet ports 64 and the outlet ports 66 to achieve the configuration as shown in FIG. 2 and as described above. The coolant can be water mixed with ethylene glycol, or any other suitable coolant, which is capable of thermally managing the various components of the electrified vehicle 12.

During operation of the system, thermal energy may be transferred from the coolant to ambient air outside the vehicle within the radiator 106. A fan (not shown) may be positioned adjacent to the radiator 106 and is configured to draw an airflow through the radiator 106 for undergoing convective heat transfer with the coolant. For example, the airflow exchanges heat with the coolant as the two fluids flow across/through the radiator 106. The cooled coolant may then be returned to the battery pack 24 and/or the power electronics module 90, for example.

The subject disclosure provides a thermal management system 140 that consolidates manifold valves, coolant lines, and connections into a compact coolant distribution module 60. In one disclosed example, the thermal management system 140 reduces the number of hoses by close to 40% and the number of coolant connectors by 90% compared to prior configurations. This provides a significant cost savings from a component level aspect and will also provide for cost reductions in manufacturing and assembly. Additionally, the single coolant distribution module 60 can be used across all vehicle platforms without having to change the coolant system architecture due to the module's modular and flexible design.

In the disclosed example, only one T-fitting 144 (FIG. 4) is used within the entire thermal management system 140. In this example, the T-fitting 144 has an outlet 146 in communication with the inlet 112 to the power electronics module 90, a first inlet 148 in communication with an outlet 150 from the radiator 106, and a second inlet 152 in communication with the third outlet port 66C. The fifth outlet port 66E is in communication with the fifth output 74*l* from the first manifold valve 68 and the fifth output 78*i* from the second manifold valve 70. In one example, a degas bottle 180 can include line connections to the thermal management system via the coolant distribution module with appropriate inlet and outlet port provisions.

In one example, the module body 62 comprises a block shaped structure (FIG. 3) having a first side A facing a front of the vehicle 12, a second side B facing a rear of the vehicle 12, third side C facing one side of the vehicle 12, e.g. a right side, a fourth side D facing an opposite side of the vehicle 12, e.g. a left side, a fifth side E facing upwardly, and a sixth side (not shown) facing downwardly toward ground. In one example, the plurality of inlet ports 64 comprises at least nine inlet ports 64A-I and the plurality of outlet ports 66 comprises at least ten outlet ports 66A-J. Depending on the type and/or size of vehicle, and the relative location of the different subsystem components that are connected to the thermal management system, the module 60 can be configured to have the inlet and outlet ports located on any of the plurality of sides in any of various combinations with the intent of optimizing the number, length, and package complexity of all the remaining coolant hoses in the vehicle.

In one example: the third inlet port 64 C is formed in the first side A; the second, fourth and sixth inlet ports 64B, 64D, 64F are formed in the second side B; and the first, fifth, seventh, eighth, and ninth inlet ports are 64A, 64E, 64G, 64H, 64I, are formed on the third side C. In one example: the second and the fifth outlet ports 66B, 66E are formed on the first side A; the third, fourth and eighth outlet ports 66C, 66D, 66H are formed on the second side B; and the first, sixth, seventh, ninth, and tenth outlet ports 66A, 66F, 66G, 66I, 66J are formed on the third side C. By placing the inlet and outlet ports in these configurations, the length of associated connection hoses can be minimized as much as possible.

An example method of making the coolant distribution module includes forming a single module body 62 to include the plurality of inlet ports 64, the plurality of outlet ports 66, and the first 68 and second 79 manifold valves within the single module body 62. In one example, the single module body 62 is formed using an additive manufacturing process, e.g. a 3-D printing process, where a chosen material is laid down or deposited layer by layer to form a three-dimensional object. Any type of additive manufacturing process can be used to form the single module body 62.

In one example, the thermal management system 140 may include a plurality of pumps associated with the heat exchangers to circulate the coolant throughout the system. In one example, a first pump 160 is located between the outlet 80 of the first heat exchanger 82 and the first inlet port 64A, a second pump 162 is located between the outlet 94 of the second heat exchanger 96 and the fifth inlet port 64E, a third pump 164 is located between the outlet 116 of the third heat exchanger 118 and the seventh inlet port 64G, a fourth pump 166 is located between the outlet 120 of the fourth heat exchanger 122 and the eighth inlet port 64H, and a fifth pump 168 is located between the outlet 124 of the fifth heat exchanger 126 and the ninth inlet port 64I. In one example, the pumps are electrically powered fluid pumps; however, other types of fluid pumps could also be utilized as part of the thermal management system 140 within the scope of this disclosure.

In one example, the first 82 and second 96 heat exchangers can comprise a first type of heat exchanger. In one example, the third 118, fourth 122, and fifth 126 heat exchangers can comprise a second type of heat exchanger different from the first type. The combination of heat exchangers and pump locations are merely examples and it should be understood that other configurations could be used dependent upon vehicle application and/or size.

A control unit C (FIG. 3) may control operations of the thermal management system 140. The control unit could be a stand-alone control unit associated with the thermal management system or could be part of an overall vehicle control unit, such as a vehicle system controller (VSC) that includes a powertrain control unit, a transmission control unit, an engine control unit, a battery control module, etc. It should therefore be understood that the control unit and one or more other controllers can collectively be referred to as a "control unit" that is configured to control, such as through a plurality of integrated algorithms, various actuators in response to signals from various sensors associated with the thermal management system. The various controllers that make up the VSC can communicate with one another using a common bus protocol (e.g., CAN), for example.

Figure 3:
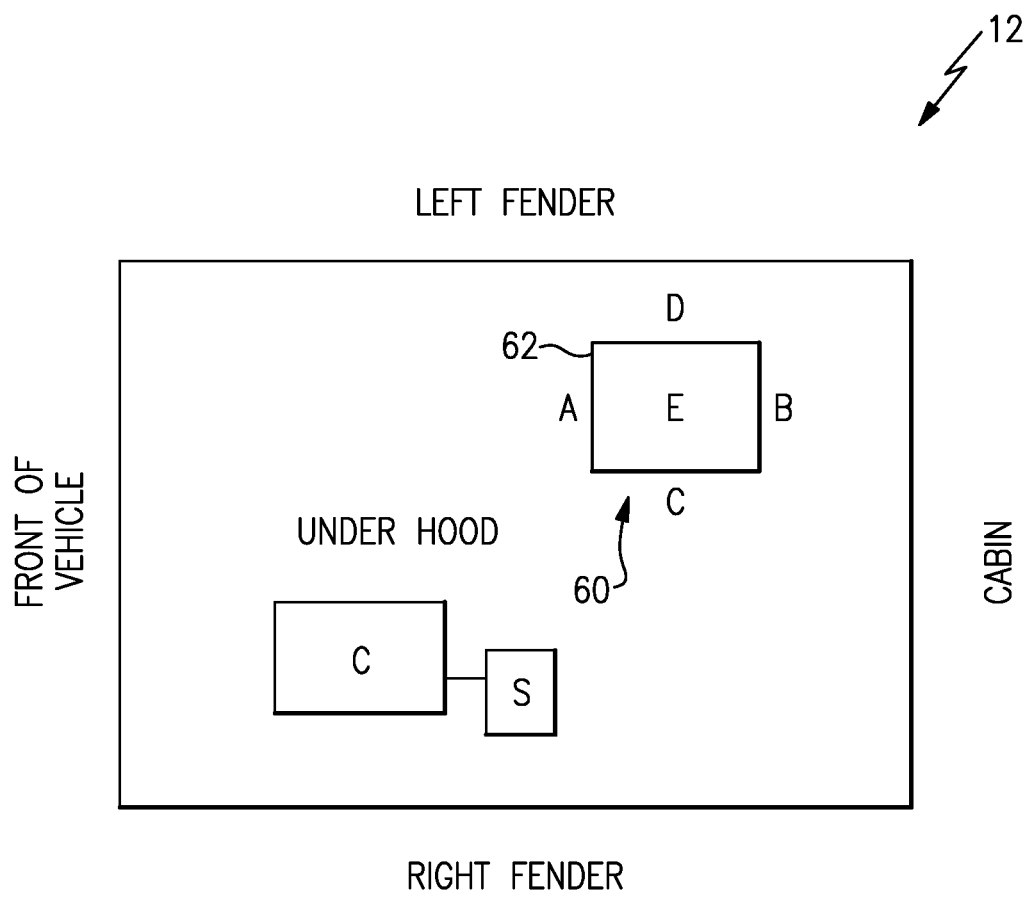
FIG. 3 schematically illustrates the coolant distribution module positioned within the electrified vehicle.

In an embodiment, the control unit is programmed with executable instructions for interfacing with and operating the various components of the thermal management system for thermally managing the battery pack 24 and/or the power electronics module 90 and cabin. The control unit may include various inputs and outputs for interfacing with the various components of the thermal management system 140, including but not limited to the battery pack 24, the power electronics module 90, the pumps 160-168, the coolant distribution module 60, and any associated system sensors S (FIG. 3). The control unit may further include a processor and non-transitory memory for executing the various control strategies and modes of the thermal management system.

The subject of the disclosure provides for a coolant distribution module that is a very compact, universal, and cost-effective solution that can enable over twenty thermal modes for an electrified vehicle thermal management system. This is a significantly higher number of thermal modes than are available in traditional systems. The coolant distribution module is one of the key enablers to provide a higher efficiency, modular, scalable and low-cost thermal system architecture for all electrified vehicles. The coolant distribution module is universal because the same module can be used across different vehicle lines which have a similar thermal system architecture. The same distribution module could be used on various vehicle lines irrespective of its performance capability and requirements. If fewer input ports and/or output ports are required for a certain vehicle, the additional inlet/outlet ports can simply be capped.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. An apparatus comprising:
   a module body comprising a single-piece, unitary body that incorporates both a first manifold valve and a second manifold valve, wherein the module body includes a plurality of inlet ports and a plurality of outlet ports;
   the first manifold valve including a plurality of first valve inputs in communication with one or more of the plurality of inlet ports and a plurality of first valve outputs in communication with one or more of the plurality of outlet ports; and
   the second manifold valve includes a plurality of second valve inputs in communication with one or more of the plurality of inlet ports and a plurality of second valve outputs in communication with one or more of the plurality of outlet ports.

2. The apparatus as recited in claim 1, wherein the first manifold valve comprises a first nine-way manifold valve and the second manifold valve comprises a second nine-way manifold valve.

3. The apparatus as recited in claim 2, wherein the first nine-way manifold valve operates at a first temperature range and the second nine-way manifold valve operates at a second temperature range different from the first temperature range.

4. The apparatus as recited in claim 1, including at least one heat exchanger having an inlet in communication with at least one outlet port associated with at least one first valve output and an outlet in communication with at least one inlet port associated with at least one first valve input.

5. The apparatus as recited in claim 4, including at least one pump located between the outlet of the at least one heat exchanger and the at least one inlet port.

6. The apparatus as recited in claim 1, including a plurality of heat exchangers, wherein each heat exchanger has an inlet in communication with at least one outlet port associated with at least one first valve output and an outlet in communication with at least one inlet port associated with at least one first valve input.

7. The apparatus as recited in claim 6, including at least one pump located between the outlet of each heat exchanger and an associated at least one inlet port.

8. The apparatus as recited in claim 1, including at least one heat exchanger having an inlet in communication with at least one outlet port associated with at least one second valve output and an outlet in communication with at least one inlet port associated with at least one second valve input.

9. The apparatus as recited in claim 8 including at least one pump located between the outlet of the at least one heat exchanger and the at least one inlet port.

10. The apparatus as recited in claim 1, including a plurality of heat exchangers, wherein each heat exchanger has an inlet in communication with at least one outlet port associated with at least one second valve output and an outlet in communication with at least one inlet port associated with at least one second valve input.

11. The apparatus as recited in claim 10, including at least one pump located between the outlet of each heat exchanger and an associated at least one inlet port.

12. The apparatus as recited in claim 1, including:
    at least one first heat exchanger having a first inlet in communication with at least one outlet port associated with at least one first valve output and a first outlet in communication with at least one inlet port associated with at least one first valve input; and
    at least one second heat exchanger having a second inlet in communication with at least one outlet port associated with at least one second valve output and a second outlet in communication with at least one inlet port associated with at least one second valve input.

13. The apparatus as recited in claim 12, including:
    at least one first pump associated with the first manifold valve and located between the first outlet of the at least one first heat exchanger and the at least one inlet port; and
    at least one second pump associated with the second manifold valve and located between the second outlet of the at least one second heat exchanger and the at least one inlet port.

14. The apparatus as recited in claim 1, including:
    a plurality of first heat exchangers each having a first inlet in communication with at least one outlet port associated with at least one first valve output and a first outlet in communication with at least one inlet port associated with at least one first valve input; and
    a plurality of second heat exchangers each having a second inlet in communication with at least one outlet port associated with at least one second valve output and a second outlet in communication with at least one inlet port associated with at least one second valve input.

15. The apparatus as recited in claim 14, including:
a plurality of first pumps associated with the first manifold valve, wherein each first pump is located between a respective outlet of a respective first heat exchanger and a respective inlet port; and
a plurality of second pumps associated with the second manifold valve, wherein each second pump is located between a respective outlet of a respective second heat exchanger and a respective inlet port.

16. A method comprising:
forming a module body as a single-piece, unitary body that incorporates both a first manifold valve and a second manifold valve, wherein the module body includes a plurality of inlet ports and a plurality of outlet ports;
forming the first manifold valve to include a plurality of first valve inputs in communication with one or more of the plurality of inlet ports and a plurality of first valve outputs in communication with one or more of the plurality of outlet ports; and
forming the second manifold valve to include a plurality of second valve inputs in communication with one or more of the plurality of inlet ports and a plurality of second valve outputs in communication with one or more of the plurality of outlet ports.

17. The method as recited in claim 16, including forming the module body using an additive manufacturing process.

18. The method as recited in claim 16, including connecting the module body to a coolant distribution system that includes a plurality of heat exchangers, at least one radiator, a power electronics module, a battery back, and a HVAC system, wherein only one T-fitting is used within the coolant distribution system.

19. The method as recited in claim 16, including associating at least one heat exchanger with the first manifold valve and/or the second manifold valve, and providing at least one pump for each heat exchanger.

20. The method as recited in claim 16, including associating a plurality of heat exchangers with the first manifold valve and/or the second manifold valve, and providing at least one pump for each heat exchanger.

\* \* \* \* \*